US008708320B2

(12) United States Patent
Steidl et al.

(10) Patent No.: US 8,708,320 B2
(45) Date of Patent: Apr. 29, 2014

(54) SPLASHGUARD AND INLET DIFFUSER FOR HIGH VACUUM, HIGH FLOW BUBBLER VESSEL

(75) Inventors: Thomas Andrew Steidl, Escondido, CA (US); Charles Michael Birtcher, Valley Center, CA (US); Xinjian Lei, Vista, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 1021 days.

(21) Appl. No.: 11/939,109

(22) Filed: Nov. 13, 2007

(65) Prior Publication Data

US 2008/0143002 A1      Jun. 19, 2008

Related U.S. Application Data

(60) Provisional application No. 60/908,376, filed on Mar. 27, 2007, provisional application No. 60/875,200, filed on Dec. 15, 2006.

(51) Int. Cl.
*B01F 3/04* (2006.01)

(52) U.S. Cl.
USPC ............................ 261/122.1; 96/189; 96/190

(58) Field of Classification Search
USPC .............. 261/122.1, 122.2, 124; 96/189, 190
See application file for complete search history.

(56) References Cited

U.S. PATENT DOCUMENTS

| | | | | |
|---|---|---|---|---|
| 1,756,204 A | * | 4/1930 | Linn | 261/122.1 |
| 1,912,439 A | * | 6/1933 | Feller | 426/477 |
| 1,994,766 A | * | 3/1935 | Heglar | 96/279 |
| 2,405,494 A | * | 8/1946 | Dupuy | 96/340 |
| 2,742,886 A | * | 4/1956 | McPherson | 123/363 |
| 3,542,524 A | * | 11/1970 | Kimble et al. | 422/120 |
| 4,140,735 A | | 2/1979 | Schumacher | |
| 4,251,485 A | * | 2/1981 | Schauer et al. | 422/168 |
| 4,266,950 A | | 5/1981 | Makino et al. | |
| 4,350,505 A | * | 9/1982 | Mallory et al. | 96/249 |
| 4,493,637 A | * | 1/1985 | Ganter et al. | 431/190 |
| 4,591,464 A | | 5/1986 | Kaneno et al. | |

(Continued)

FOREIGN PATENT DOCUMENTS

| EP | 0 555 614 A1 | 8/1993 |
|---|---|---|
| EP | 1329540 A2 | 7/2003 |

(Continued)

OTHER PUBLICATIONS

Mott Corporation, Porous Metal Solutions, Nov. 2000.

*Primary Examiner* — Charles Bushey
(74) *Attorney, Agent, or Firm* — Rosaleen P. Morris-Oskanian; Lina Yang; Joseph D. Rossi

(57) ABSTRACT

The present invention is a bubbler having a diptube inlet ending in a bubble size reducing outlet and at least one baffle disc positioned between the outlet of the diptube and the outlet of the bubbler to provide a narrow annular space between the baffle disc and the wall of the bubbler to prevent liquid droplets from entering the outlet to the bubbler. The bubble size reducing outlet is an elongated cylindrical porous metal frit situated in a sump of approximately the same dimensions. A metal frit is placed at the inlet of the outlet of the bubbler. The present invention is also a process of delivering a chemical precursor from a bubbler vessel having the above structure.

10 Claims, 8 Drawing Sheets

(56) References Cited

U.S. PATENT DOCUMENTS

| | | | |
|---|---|---|---|
| 4,734,999 A * | 4/1988 | Fujisawa et al. | 34/576 |
| 4,861,524 A | 8/1989 | Sielaff et al. | |
| 5,062,292 A | 11/1991 | Kanba et al. | |
| 5,520,858 A * | 5/1996 | Yamaguchi et al. | 261/130 |
| 5,589,110 A | 12/1996 | Motoda et al. | |
| 6,077,356 A | 6/2000 | Bouchard | |
| 6,444,038 B1 | 9/2002 | Rangarajan et al. | |
| 6,500,244 B2 * | 12/2002 | Sanchez | 96/340 |
| 6,520,218 B1 | 2/2003 | Gregg et al. | |
| 6,616,733 B1 * | 9/2003 | Pellegrin | 95/150 |
| 6,736,154 B2 | 5/2004 | Xu et al. | |
| 6,874,770 B2 | 4/2005 | Torkaman | |
| 7,011,299 B2 | 3/2006 | Curran | |
| 7,077,388 B2 | 7/2006 | Stamp et al. | |
| 7,300,038 B2 * | 11/2007 | Gregg et al. | 261/23.1 |
| 7,464,917 B2 * | 12/2008 | Lee et al. | 261/121.1 |
| 8,162,296 B2 * | 4/2012 | Birtcher et al. | 261/121.1 |
| 2002/0145210 A1 | 10/2002 | Tompkins et al. | |
| 2003/0042630 A1 | 3/2003 | Babcoke et al. | |
| 2003/0116019 A1 | 6/2003 | Torkaman | |
| 2004/0013577 A1 | 1/2004 | Ganguli et al. | |

FOREIGN PATENT DOCUMENTS

| | | |
|---|---|---|
| EP | 1669474 A1 | 6/2006 |
| JP | 6283400 | 4/1987 |
| JP | 6241132 | 10/1988 |
| JP | 63149521 | 10/1988 |
| JP | 04356915 A | 12/1992 |
| JP | 05335243 A | 12/1993 |
| JP | 2001313288 | 11/2001 |
| JP | 2006161162 | 12/2005 |
| KR | 2005-44629 A | 5/2005 |
| WO | 99/16929 A1 | 4/1999 |
| WO | 99/27328 A1 | 6/1999 |
| WO | 03/047735 A1 | 6/2003 |

* cited by examiner

SPLASHGUARD AND INLET DIFFUSER FOR HIGH VACUUM, HIGH FLOW BUBBLER VESSEL

CROSS REFERENCE TO RELATED APPLICATIONS

The present application claims the benefit of U.S. Provisional Patent Applications 60/875,200 filed Dec. 15, 2006 and 60/908,376 filed Mar. 27, 2007.

BACKGROUND OF THE INVENTION

The electronics fabrication industry uses chemical precursor containers that convert liquid chemicals into chemical vapor for delivery to electronics fabrication reactors, i.e. tools, for conducting chemical vapor deposition ("CVD"). CVD is a favored technique for forming layers, films and other depositions in the construction of electronic fabrications such as integrated circuits or computer chips. Liquids or solids are preferred as sources of supply because of the efficiency of transport and storage of a volume of chemical precursor, but the industry frequently prefers to actually deliver the chemical precursor at the site of the tool in the form of a vapor, i.e. CVD. Alternatively, some fabrications are conducted using direct liquid injection ("DLI"), although even then, the liquid is vaporized in the tool after delivery.

When using vapor delivery for CVD, the containers typically have an inert carrier gas passed through them or bubbled, i.e., bubbler, to carry entrained chemical precursor vapor in the inert carrier gas to the tool. Bubblers typically have a downtube inlet where the carrier gas is introduced into the container under the surface of the liquid chemical precursor wherein the carrier gas bubbles up through the liquid chemical precursor, entraining the chemical precursor as the carrier gas surfaces the liquid as a bubble and exits the container or bubbler by an outlet set above the liquid level of the chemical precursor.

It is undesirable to have the chemical precursor leave the container through the outlet in the liquid form, even as small droplets. A homogenous vapor is preferred as the dispensed product of such bubblers. This avoids corrosion, cleanup, and uneven flow, especially through mass flow controllers which control the flow of chemical precursor from the bubbler to the tool in a precisely metered fashion.

The industry has attempted various forms of splashguards for bubblers to address this issue, such as in: U.S. Pat. No. 6,520,218; EP 1 329 540; US 2004/0013577; EP 0 420 596; U.S. Pat. No. 5,589,110; U.S. Pat. No. 7,077,388; US 2003/0042630; U.S. Pat. No. 5,776,255; and U.S. Pat. No. 4,450,118. Each of these attempts to provide splashguard function has had less than desired performance, but the present invention as disclosed below successfully provides high levels of splashguard function, while still allowing high flows of chemical precursor or flows under high vacuum or high pressure differential conditions as will be described and illustrated below.

BRIEF SUMMARY OF THE INVENTION

The present invention is a bubbler having a diptube inlet ending in a bubble size reducing outlet and at least one baffle disc positioned between the outlet of the diptube and the outlet of the bubbler configured to provide a narrow annular space between the baffle disc and the inside wall of the bubbler capable of preventing liquid droplets from entering the outlet to the bubbler. The bubble size reducing outlet is a tubular porous diffuser situated in a sump in the floor or bottom of the bubbler container wherein the sump is shaped to the approximate size and shape of the diffuser with sufficient tolerance to allow bubbles to escape the diffuser and liquid product to surround the diffuser in the sump.

The present invention is also a process of delivering a chemical precursor from a bubbler vessel comprising; passing a carrier gas through a diptube of a bubbler and further through a bubble size reducing outlet, such as a diffuser in a sump; entraining liquid chemical precursor from the bubbler into the carrier gas; passing the entrained chemical precursor and carrier gas past at least one baffle disc in a narrow annular space between the outer perimeter of the baffle disc and the inner surface of bubbler sidewall.

DETAILED DESCRIPTION OF THE INVENTION

Figure 1:
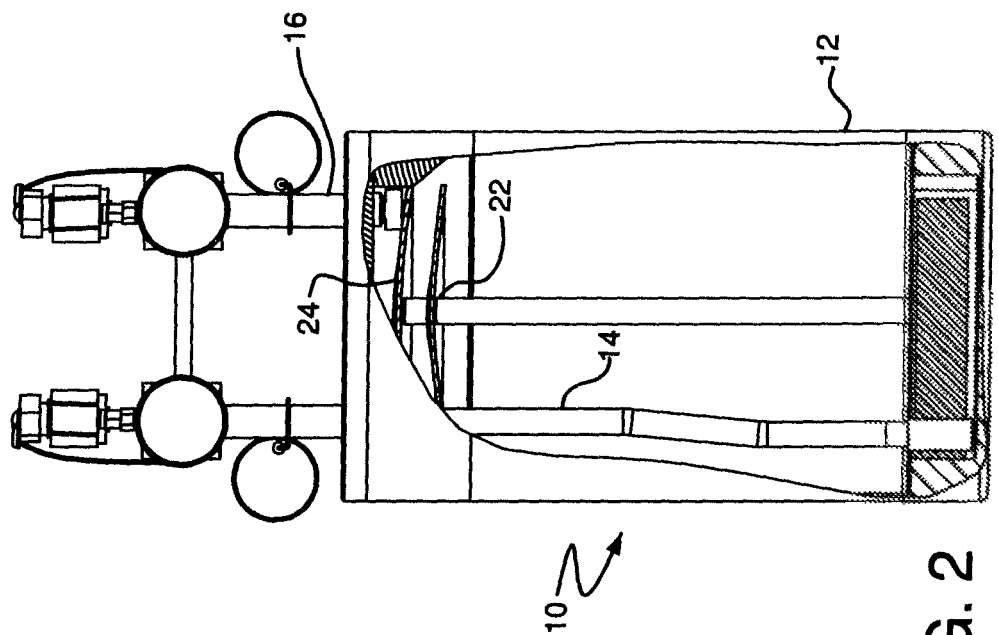
FIG. 1 is a schematic side view of a first embodiment of the present invention.

The present invention is a vapor generation bubbler designed for service in high vacuum or high flowrate conditions. The design prevents splashing and transport of aerosol droplets into the outlet delivery line that would result in erratic chemical mass flow delivery.

Semiconductor manufacturers are turning to the use of high value chemicals that are increasingly difficult to transport for deposition onto a wafer in a vacuum chamber or tool. The vessel or bubbler of the present invention allows liquid chemical to be delivered from the container or bubbler as a vapor at high vacuum, without the splashing and the formation of aerosol droplets in the outlet of the vessel or bubbler that result in erratic chemical mass delivery rate. The present invention has a lower surface design that enables a constant saturation of a carrier gas with chemical vapor down to very low levels of the residual chemical. Yet, the present invention prevents splashing and the formation of aerosol droplets into the outlet of the bubbler, that would result in erratic chemical mass delivery rate, even when the chemical level in the container is high. Previously, bubblers used for high vacuum service or high flowrate service had to be used with only a partial charge of chemical (i.e.: 50% full). This required the semiconductor manufacturer to change the vessel or bubbler more often (taking down the tool), and added to the cost of the chemical, because of the increased container processing fees. This invention enables use of the bubbler from a full liquid chemical level down to a very low level and reduces semiconductor tool downtime. Also, since it is effective at limiting the chemical aerosol particles in the outlet, it can reduce particulate generation that might result from degradation of the aerosol droplets that deposit in the outlet and all of the delivery piping to the processing chamber or tool.

Previous bubbler designs addressed the problem of splashing by installing at the bottom of the dip tube, piping, perpendicular to the diptube, with holes drilled along its length. This resulted in smaller bubbles generated over a larger area of the bubbler, which resulted in a less turbulent bubbling action, and therefore, less splashing, but these inventions are impossible to effectively clean for reuse by the chemical supplier.

The present invention uses porous masses of material, such as porous metal frits, at the outlet of the inlet diptube to break down the size of the bubbles of inert carrier gas entering the liquid chemical precursor in conjunction with one or more baffle discs at the upper part of the vessel or bubbler that requires the carrier gas entrained with chemical precursor to pass indirectly to the outlet of the container or bubbler by flowing tortuously to the outside of the baffle discs in a narrow annular space between the inner diameter of the bubbler inside wall and the outer diameter or circumferential or perimeter edge of the baffle discs. This will be illustrated with reference to several preferred embodiments of the present invention.

FIG. 1 shows a bubbler 10 of the present invention having a cylindrical bubbler sidewall 12 with a diptube inlet 14 terminating at its inlet end with a porous mass or block outlet, such as a stainless steel frit 18 that operates as a gas diffuser to generate small microbubbles of the inert carrier gas below the surface of the liquid chemical precursor (not illustrated). This reduces the chance of violent bubbling or the splattering of liquid above the headspace or freeboard of the bubbler. The outlet 18 of the bubbler diptube inlet 14 is proximate the floor of the bubbler in a sump 21, shown in FIG. 5.

In addition, the diptube 14 has a baffle disc 20, having a circular and concave downward configuration like a shallow cone opening downward, affixed, as by welding, to the upper end of the diptube 14, to further avoid liquid splattering or large scale liquid entrainment of the carrier gas flowing to the outlet 16, which is undesired, but which has a greater probability under high flow or high vacuum conditions.

Figure 2:
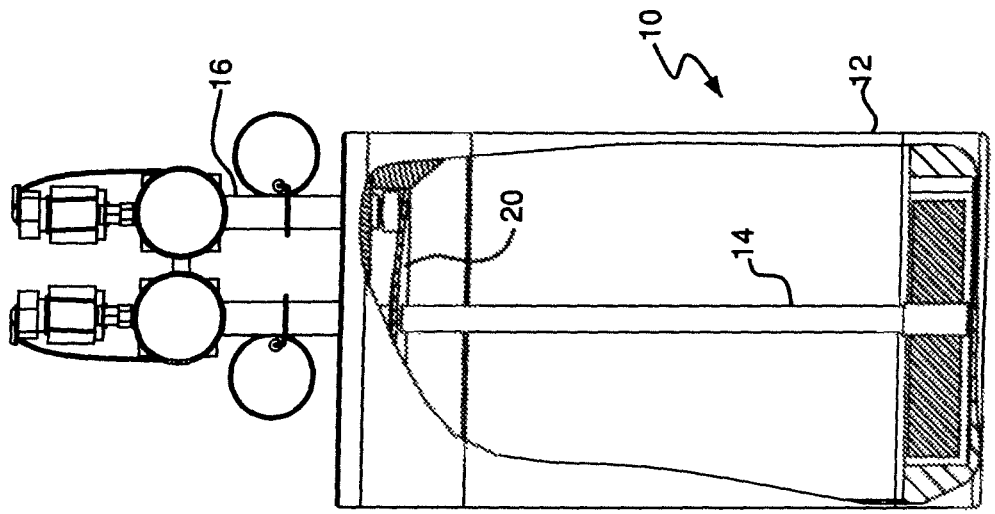
FIG. 2 is a schematic side view of a second embodiment of the present invention.

FIG. 2 shows a second embodiment of the present invention where similar parts have similar part numbers. Here the splash guard comprises two baffle discs, a lower baffle disc 22 and an upper baffle disc 24 having a circular outer edge shape and being concave downward, such as a shallow downwardly open cone, that act in cooperation to make an even more tortuous path for chemical precursor leaving the bubbler 10. The baffle discs are concave downward to further frustrate direct flow of chemical precursor to the outlet 16 and to collect condensed chemical precursor for return by coalesced droplets falling back into the stored chemical precursor (not illustrated). The baffle discs have a diameter slightly less than the inside diameter of the cylindrical inside wall of the bubbler. The space between the circumferential or perimeter edge of the baffle disc and the inside wall of the bubbler is sufficient to allow gas to pass through the space with minimal pressure drop, but sufficiently narrow to minimize the passage of liquid that may be ejected from the liquid content of the bubbler under high flow rates of carrier gas through the diptube or significant pressure fluctuations.

Figure 3:
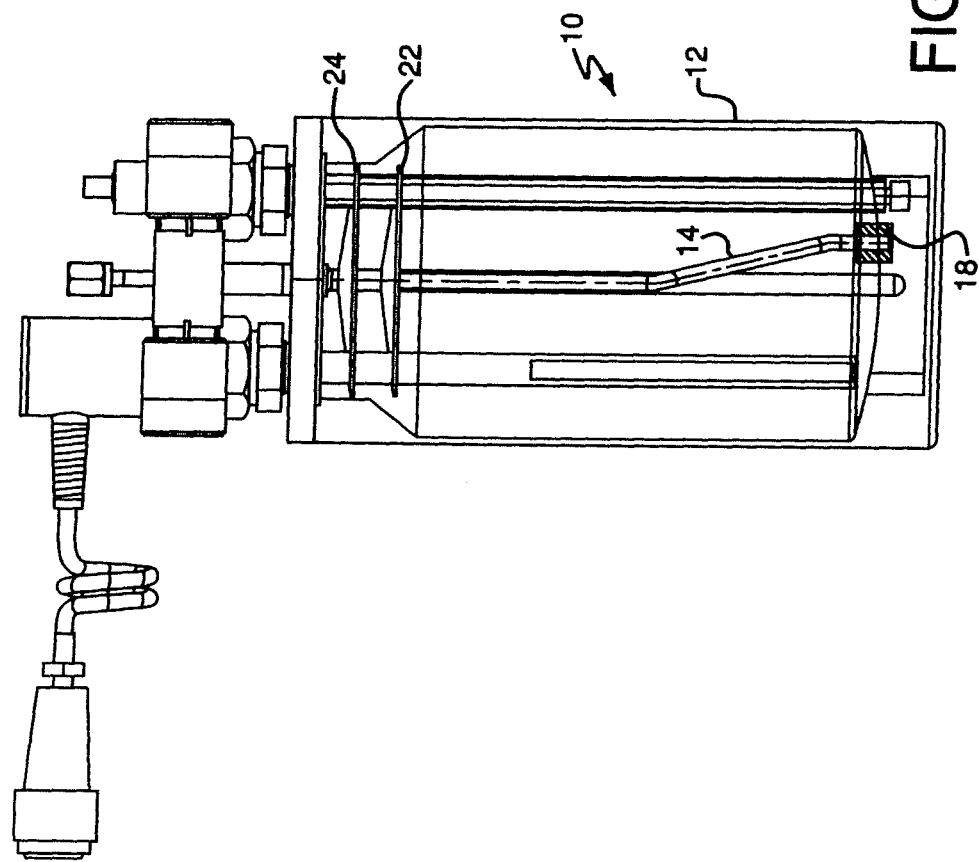
FIG. 3 is a detailed schematic side view of the second embodiment of the present invention of FIG. 2.

FIG. 3 shows a more detailed illustration of the second embodiment of the present invention. Bubbler 10 is shown in cut away with an angled diptube 14 ending in a stainless steel frit outlet 18, such as a Mott porous stainless steel cup Series 1200, catalog no 1200-A-B-L-Media grade. The two baffle discs 22 and 24 occupy different inside diameter locations in the container sidewall 12 so that the lower baffle disc 22 allows greater annular space from the cylindrical inside surface of the bubbler sidewall 12 for carrier gas and chemical precursor to pass toward the outlet, while upper baffle disc 24 provides less annular space to further avoid liquid entrainment in the outlet and downstream piping from the outlet.

Figure 4:
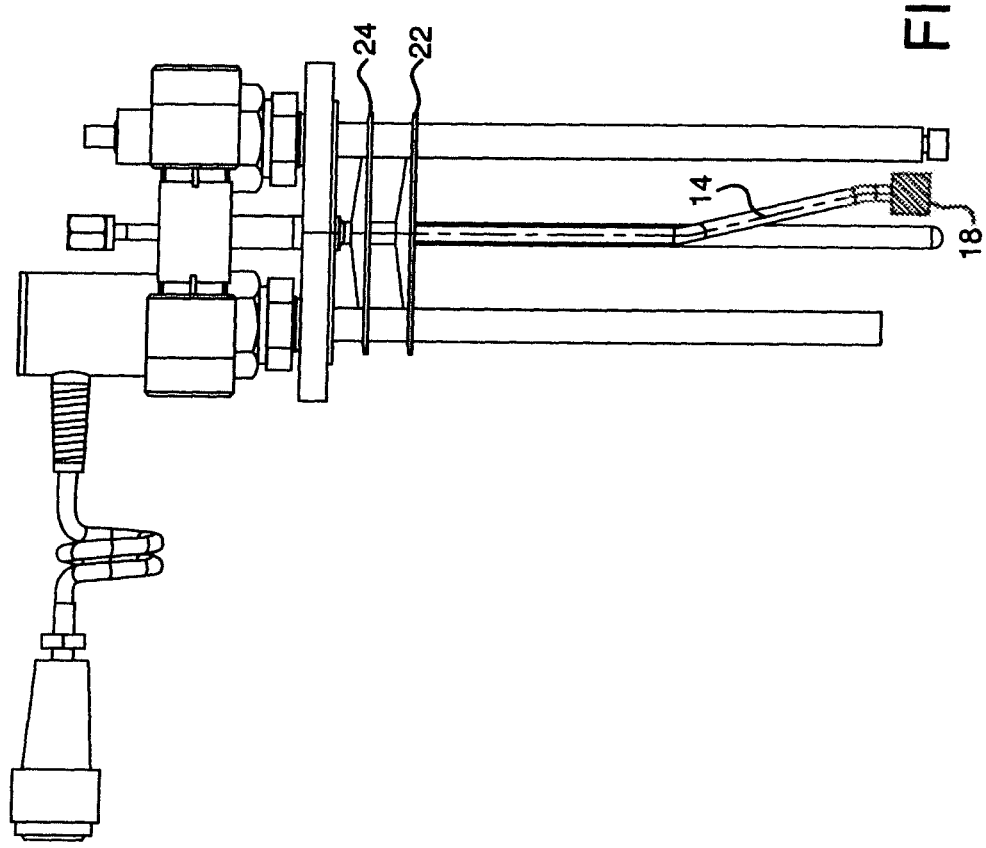
FIG. 4 is a detailed schematic side view of the inner function structures of the second embodiment of the present invention of FIG. 3.

FIG. 4 shows an isolation of the internal structure of the bubbler of the second embodiment without the sidewall 12 being illustrated. In FIG. 4, the diptube inlet 14 and its outlet frit 18 are easily seen and the splash guard comprising baffle disc 22 and 24 are also readily seen with their concave downward shape.

Figure 5:
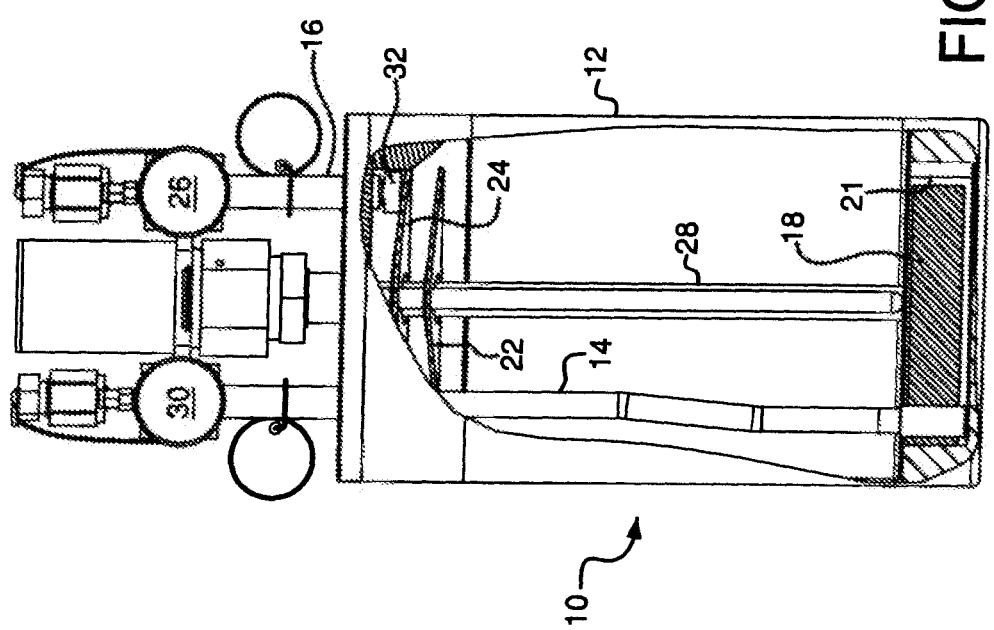
FIG. 5 is a detailed schematic side view of the inner function structures of the second embodiment of the present invention of FIG. 2 showing a diffuser in a sump configured to the approximate shape of the diffuser.

FIG. 5 shows a specific configuration of the second embodiment of FIG. 2 in which the gas diffuser outlet 18 is shown as an horizontally disposed elongated cylindrical porous metal frit having a hollow gas passage interior and a porous metal frit outer shell, such as those made by Mott Corporation, Farmington, Conn. 06032, USA. Preferably, the porous metal frit gas diffuser outlet 18 has a media grade rating to filter out particles of 1 micron or larger, preferably filtering out at least 90% of particles 1 micron or larger.

The gas diffuser outlet 18 of FIG. 5 is situated in a sump 21 in the base, floor or bottom of the bubbler container 12. The preferred diffuser 18 is an horizontally disposed elongated cylinder and the sump is thus a partial elongated cylinder open at its upper side to the inside of the bubbler and being of a dimension slightly larger than the elongated cylinder of the diffuser outlet 18, sufficient to allow gas bubbles of carrier gas to escape the outside of the diffuser outlet 18 and to allow liquid chemical precursor stored in the bubbler or vessel 10 to reside in the sump 21 substantially or completely surrounding the diffuser outlet 18. Preferably, the diffuser outlet 18 resides entirely with the sump 21, such that the upper surface of the diffuser is no more than even with the upper edge of the sump wall. The level sensor 28 measures the liquid product level. Inlet 14 is controlled by inlet valve 30, and outlet 16 is controlled by valve 26. The goal of FIG. 5 is to provide adequate flow of gas to entrain liquid product without creating bubbles of such size as to create splashing or violent spitting of the liquid getting to the outlet and downstream of the bubbler. This could contaminate the outlet or create flow problems in any downstream mass flow controller. To further avoid liquid escape from the bubbler, a metal frit 32 can be positioned at an inlet to the outlet 16.

Figure 6:
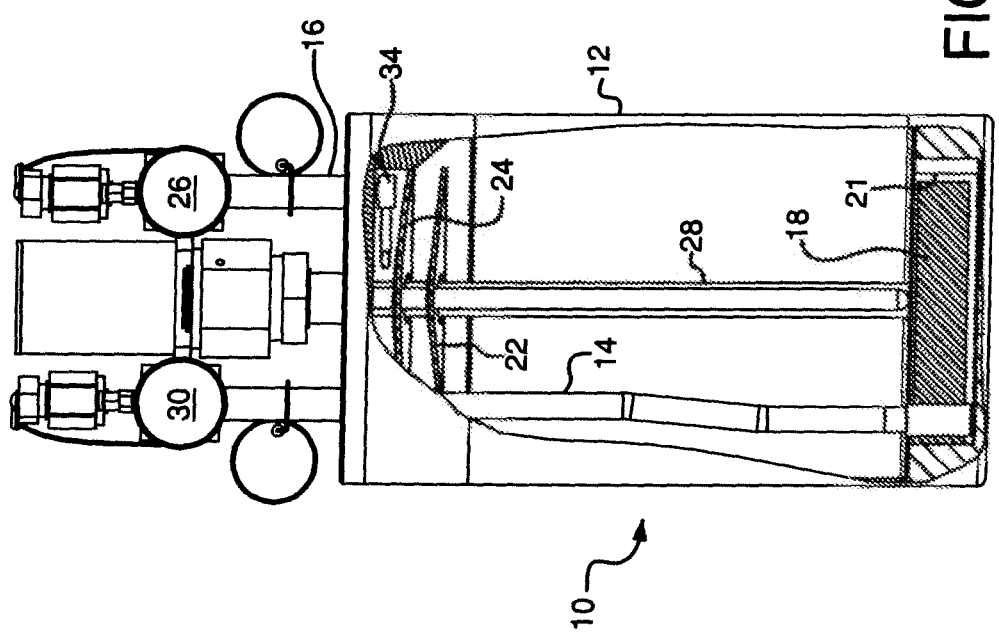
FIG. 6 is a detailed schematic side view of the inner function structures of FIG. 5 showing an alternate elbow outlet 34.

FIG. 6 shows the embodiment of FIG. 5 in which an elbow configuration or shape 34 of the inlet to the outlet 16 is used in place of metal frit 32. The end of elbow 34 is directed radially inward away from the outer circumferential or perimeter edge of the baffle discs 22 and 24 and toward the axial center of the cylinder formed by the sidewall 12 of the vessel or bubbler 10 to minimize possible liquid introduction into the outlet 16.

Figure 7:
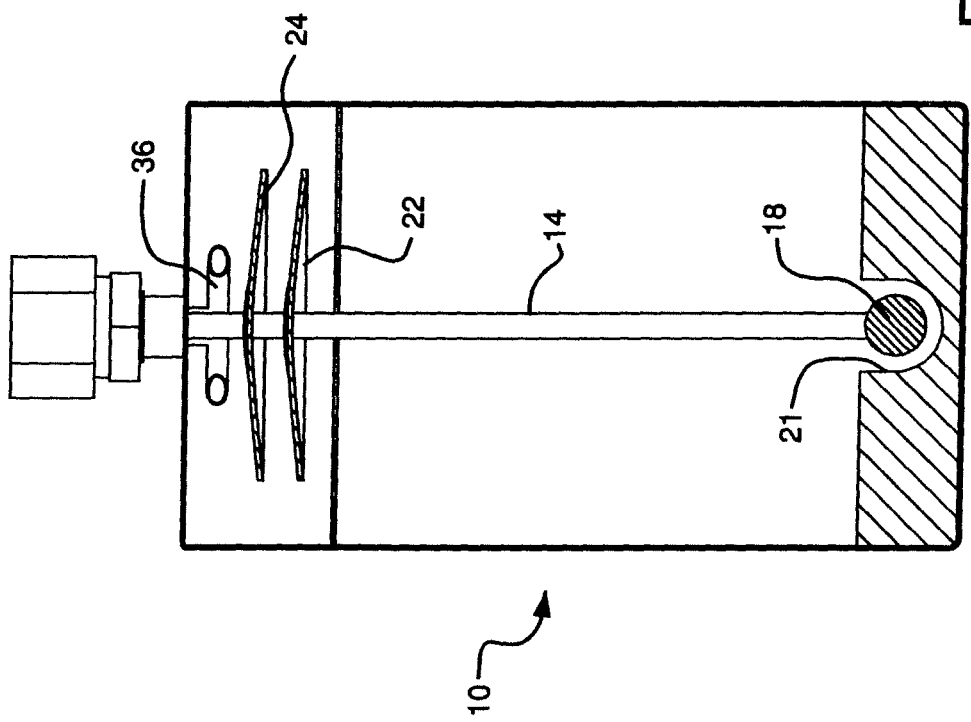
FIG. 7 is a detailed schematic side view of the inner function structures of FIG. 5 showing an alternate "Tee" outlet 36.

Similarly, FIG. 7 shows an alternate to FIG. 6 wherein the elbow outlet 34 is replaced with a "Tee" shaped or configured inlet 36 to the outlet, again to minimize the possible introduction of liquid into the outlet 16 from the annular space between the baffle discs 22 and 24 and the inside wall of the sidewall 12 of the vessel or bubbler 10.

Figure 8:
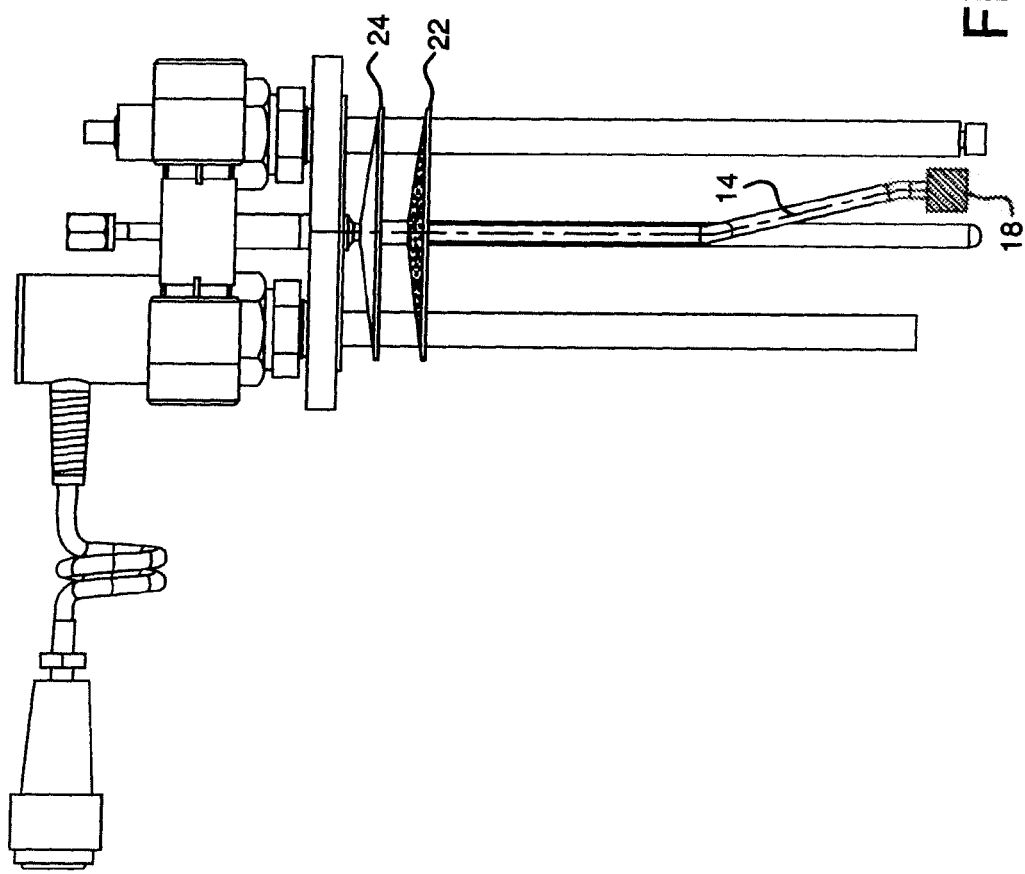
FIG. 8 is a detailed schematic side view of the inner function structures of FIG. 4 showing an alternate embodiment where baffle disc 22 has perforations 38.
Figure 9:
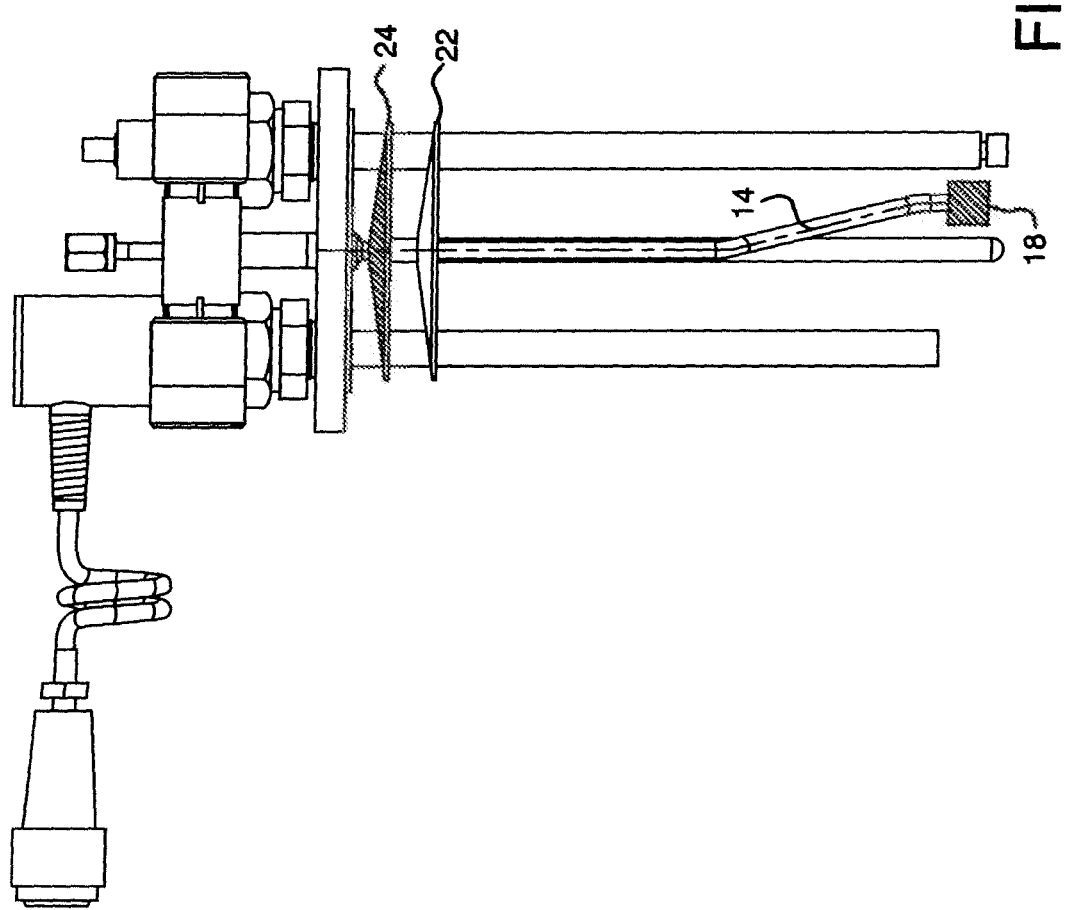
FIG. 9 is a detailed schematic side view of the inner function structures of FIG. 4 showing an alternate embodiment where baffle disc 24 is constructed of a porous metal frit material.

To avoid liquid introduction into the outlet 16, it is further possible to change the construction of the baffle discs. FIG. 8 shows lower baffle disc 22 with a plurality of perforations 38 to trap liquid spitting between baffle discs 22 and 24 and return it to the sump of the vessel. FIG. 9 shows that upper baffle disc 24 is fabricated from porous metal frit material, to again minimize liquid introduction into the outlet 16.

The present invention provides superior minimization of liquid entrainment of droplets in the outlet and downstream piping of a bubbler connected to a CVD tool of an electronics fabrication system. Using either a single baffle disc or multiples of the baffle disc, alone or in combination with a diffuser or frit at an outlet to the diptube inlet provides the desired minimization of liquid droplet entrainment in the outlet 16 of the bubbler.

Although the baffle discs have been shown as circular discs with a concavity where the disc is slightly smaller than the inside diameter of the cylindrical vessel or bubbler sidewall, it is understood that any baffle of any shape which provides only a narrow annular space at the inner sidewall of the vessel or bubbler is within the scope of the present invention. Likewise, any form of device with an array of small passages can be used as the frit or outlet of the diptube of the present invention.

Although, it is preferred to use stainless steel, it is envisioned that any inert material of rigid form can be used for the splash guard or frit. Plastics, metal alloys, powdered metals, fabrics, textiles and ceramics are all contemplated.

The vessel 10 can also be used for product flow in the opposite direction where outlet 16 functions as a pressurizing gas inlet to form a pressure head on liquid contained in the vessel 10 and force the liquid in liquid form through the frit 18 and out the diptube 14 for liquid delivery from the vessel using a pressurizing gas, in contrast to the vapor delivery described above.

The invention claimed is:

1. A bubbler for storing a volatile liquid chemical and delivering vapor of the volatile liquid chemical to a vapor deposition process when under vacuum, the bubbler comprising a cylindrical inside wall having a diameter, a floor, a diptube inlet ending in an outlet proximate the floor and at least one baffle disc affixed to an upper end of the diptube and positioned between the outlet of the diptube and an outlet of the bubbler, wherein the at least one baffle disc has a circumferential edge and a diameter slightly less than the diameter of the inside wall such that the space between the circumferential edge of the baffle disc and the cylindrical inside wall is sufficient to allow the vapor of the volatile liquid to pass through the space with minimum pressure drop, but sufficiently narrow to minimize the passage of liquid that may be ejected from a volatile liquid content under vacuum conditions and high flow rates of a carrier gas through the diptube, wherein the at least one baffle disc is solid and has a concave downward shape to collect condensed volatile liquid chemical for return by coalesced droplets that fall back into the stored volatile liquid chemical, wherein in operation under vacuum conditions, the bubbler is capable of preventing liquid droplets from entering the outlet of the bubbler.

2. The bubbler of claim 1 wherein the outlet is a bubble size reducing outlet.

3. The bubbler of claim 2 wherein the bubble size reducing outlet comprises a porous metal frit.

4. The bubbler of claim 3 wherein the porous metal frit has porosity to filter out particles of 1 micron or larger.

5. The bubbler of claim 4 wherein the porous metal frit has porosity to filter out greater than 90% of particles of 1 micron or larger.

6. The bubbler of claim 1 wherein an inlet to the outlet of the bubbler comprises a porous frit to minimize liquid entering the outlet of the bubbler.

7. The bubbler of claim 1 wherein an inlet to the outlet of the bubbler comprises an elbow configuration to minimize liquid entering the outlet to the bubbler.

8. The bubbler of claim 1 wherein an inlet to the outlet of the bubbler comprises a "Tee" configuration to minimize liquid entering the outlet of the bubbler.

9. The bubbler of claim 1 having at least two baffle discs comprising an upper baffle disc and a lower baffle disc.

10. A cylindrical vapor generation bubbler vessel having a diptube inlet ending in an outlet for delivering a carrier gas into the bubbler vessel and two baffle discs affixed to an upper end of the diptube, wherein the baffle discs have a circular and concave downward shape, the baffle discs comprising an upper baffle disc and a lower baffle disc, wherein the upper baffle disc and the lower baffle disc are positioned between the outlet of the diptube inlet and an outlet of the bubbler vessel configured to provide a narrow annular space between an outer circumferential perimeter edge of the baffle discs and the inside wall of the bubbler vessel, wherein the narrow annular space is capable of minimizing liquid droplets from entering the outlet to the bubbler vessel when the carrier gas is bubbled through a liquid content of the bubbler vessel to dispense the liquid as a vapor from the bubbler vessel and an inlet to the outlet of the bubbler vessel having a configuration selected from the group consisting of an elbow and a Tee shape, wherein at least one of the two baffle disc is solid.

* * * * *